(12) United States Patent
Higashidate et al.

(10) Patent No.: US 9,617,455 B2
(45) Date of Patent: Apr. 11, 2017

(54) SILICONE RESIN COMPOSITION FOR SEALANT AND POWER SEMICONDUCTOR MODULE THAT USES THIS COMPOSITION

(71) Applicant: FUJI ELECTRIC CO., LTD., Kawasaki-shi (JP)

(72) Inventors: Makoto Higashidate, Matsumoto (JP); Yuji Ichimura, Matsumoto (JP)

(73) Assignee: FUJI ELECTRIC CO., LTD., Kawasaki-Shi (JP)

(*) Notice: Subject to any disclaimer, the term of this patent is extended or adjusted under 35 U.S.C. 154(b) by 0 days.

(21) Appl. No.: 15/090,861

(22) Filed: Apr. 5, 2016

(65) Prior Publication Data
US 2016/0333239 A1  Nov. 17, 2016

(30) Foreign Application Priority Data

May 11, 2015 (JP) .................. 2015-096197

(51) Int. Cl.
C09J 183/04 (2006.01)
H01L 23/29 (2006.01)

(52) U.S. Cl.
CPC .......... *C09J 183/04* (2013.01); *H01L 23/296* (2013.01)

(58) Field of Classification Search
CPC ............. H01L 233/56; H01L 31/0203; H01L 2924/181; H01L 31/048; H01L 2224/05599; H01L 51/5237; H01L 23/296; H01L 2933/005; C09J 183/04; C09J 183/06; C09J 2483/003
See application file for complete search history.

(56) References Cited

U.S. PATENT DOCUMENTS

| 4,987,169 A | 1/1991 | Kuwata et al. | |
|---|---|---|---|
| 5,869,890 A * | 2/1999 | Nishiura | H01L 21/4807 257/705 |
| 6,425,294 B1 * | 7/2002 | Shiono | G01L 19/0038 361/823 |
| 2008/0299398 A1 * | 12/2008 | Hata | C09K 11/02 428/412 |
| 2012/0032189 A1 | 2/2012 | Hiramatsu | |

FOREIGN PATENT DOCUMENTS

| JP | H6-055897 B2 | 7/1994 |
|---|---|---|
| JP | H8-269331 A | 10/1996 |
| JP | 11-67977 * | 3/1999 |
| JP | 2008-270469 A | 11/2008 |
| JP | 2012-036274 A | 2/2012 |

\* cited by examiner

*Primary Examiner* — Jasmine Clark
(74) *Attorney, Agent, or Firm* — Rabin & Berdo, P.C.

(57) ABSTRACT

A silicone resin composition is provided that exhibits an increased adhesiveness relative to insulating circuit substrates and can prevent bubble production even when moisture absorption has occurred, exhibits an excellent heat resistance, and is free of problems such as cracking. A silicone resin composition for use as a sealant for a power semiconductor module includes an insulating circuit substrate having a Cu layer formed on a surface thereof. The silicone resin composition is formed on the Cu layer of the insulating circuit substrate, and has, after curing, a penetration of 35 to 70 and an adhesive strength of 50 to 180 kPa between the silicone resin composition and the insulating circuit substrate. The penetration is measured in accordance with JIS K 2220.

11 Claims, 7 Drawing Sheets

SILICONE RESIN COMPOSITION FOR SEALANT AND POWER SEMICONDUCTOR MODULE THAT USES THIS COMPOSITION

CROSS REFERENCE TO RELATED APPLICATION

The entire disclosure of a corresponding Japanese patent application, Serial No. JP PA 2015-096197, filed May 11, 2015, is hereby incorporated by reference.

BACKGROUND OF THE INVENTION

Field of the Invention

The present invention relates to a silicone resin composition for a sealant used for power semiconductor modules, and to a power semiconductor module that uses this composition.

Description of the Related Art

Power semiconductor devices are made into power semiconductor modules by incorporation in a package that exhibits excellent heat-dissipating characteristics and are then used as power converters for, for example, industrial machinery and transportation equipment.

Figure 5:
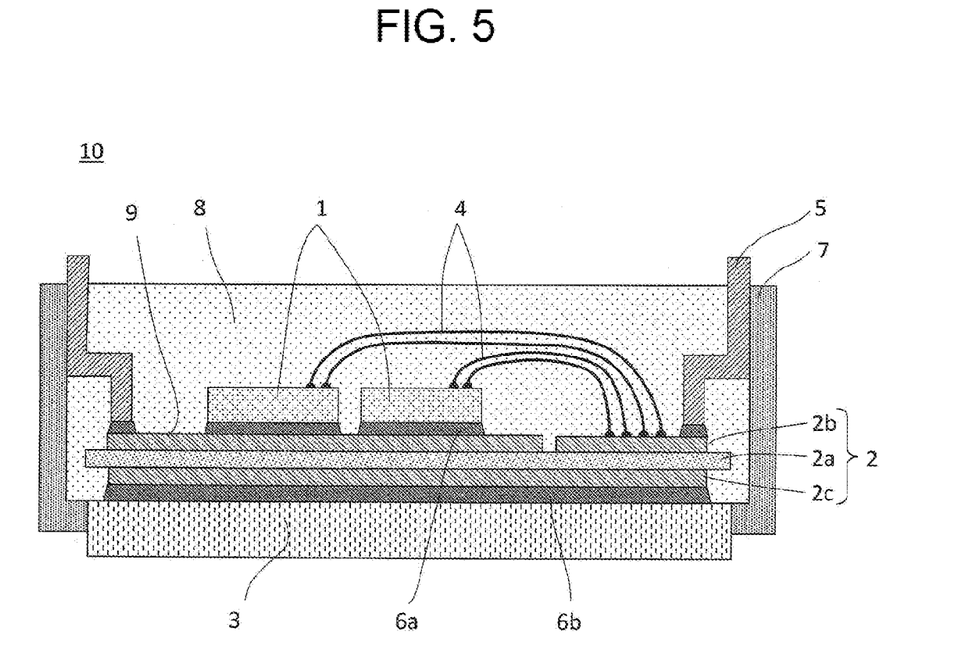
FIG. 5 is a diagram for explaining the structure of a general power semiconductor module.

The structure of a general power semiconductor module will be described using FIG. 5. A power semiconductor module 10 is provided with a semiconductor device 1; an insulating circuit substrate 2 that has a first metal layer 2b on a first main side of an insulating substrate 2a and a second metal layer 2c on a second main side; a metal plate 3; a bonding wire 4; an external terminal 5; a case 7; and a sealant 8. The back side of the semiconductor device 1 is bonded to the first metal layer 2b of the insulating circuit substrate 2 through an interposed bonding member 6a, and the second metal layer 2c of the insulating circuit substrate 2 is bonded to the metal plate 3 through an interposed bonding member 6b. The heat generated by the semiconductor device 1 is dissipated by transmission to the bonding member 6a, first metal layer 2b, insulating substrate 2a, second metal layer 2c, bonding member 6b, and metal plate 3 in the indicated sequence and is further transmitted from the metal plate 3 to a cooling device, which is not shown in the figure. The first metal layer 2b is divided into a plurality of island-shaped regions and an electrical circuit is formed by interconnection through the bonding wire 4. In addition, the external connection terminal 5 is bonded by the bonding member 6a to the first metal layer 2b to enable an electrical connection to be made to an external circuit. In order to protect the semiconductor device 1 and the insulating circuit substrate 2 from the external environment, they are housed in the case 7 and sealing is carried out by the sealant 8, e.g., a silicone gel, filled within the case 7.

Japanese Patent Application Laid-open No. 2012-36274 describes a semiconductor module sealant that is resistant to peeling and cracking even when heated; it is a mixture of a strongly branched organopolysiloxane and a weakly branched organopolysiloxane as obtained by varying the ratio between the difunctional siloxane units and trifunctional siloxane units that constitute an organosiloxane. In addition, the results are given for tensile shear testing and for the dielectric strength after a temperature cycling test.

Japanese Patent Application Laid-open No. H8-269331, on the other hand, describes a silicone gel composition for potting applications that cures by crosslinking through an alcohol-eliminating condensation, ketone-eliminating condensation, or dehydrocondensation. It is also stated that the penetration, which indicates the hardness of the silicone gel, undergoes almost no change even during exposure for 300 hours to $O_3$ and $NO_x$ generated by a spark discharge.

Japanese Patent Application Laid-open No. 2008-270469 discloses a semiconductor module structure in which a semiconductor device and an insulating circuit substrate are sealed by a silicone gel and the silicone gel is then additionally coated with a thermoplastic resin (for example, an epoxy resin). It is also stated that defects such as voids, cracks, peeling, and so forth were absent when inspection was performed with an ultrasound imaging device after a high-temperature, high-humidity test (85° C., 85% RH).

SUMMARY OF THE INVENTION

Figure 6:
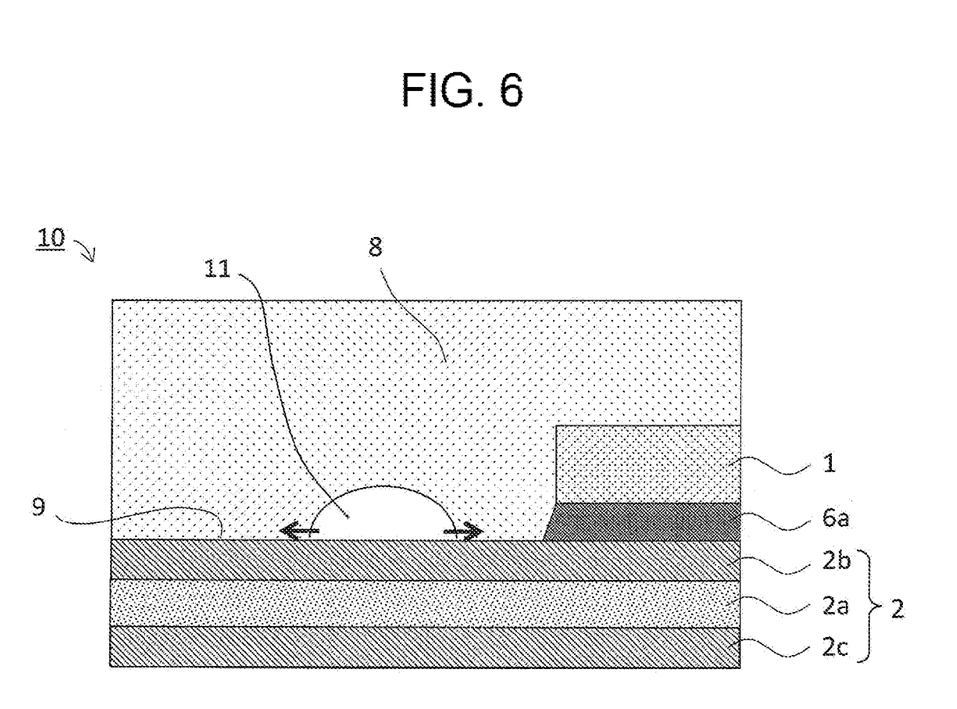
FIG. 6 is a diagram that illustrates bubble generation.

Silicone gels exhibit a high moisture permeability and the silicone gels in power semiconductor modules contain large amounts of moisture. The increase in the moisture absorption percentage is all the more substantial in the case of the acceleration in high-temperature, high-humidity testing. As shown in FIG. 6, the moisture collects at a region of weak adhesive strength at the interface 9 between the silicone gel (sealant 8) and the insulating circuit substrate 2 with the formation of a bubble 11, which undergoes additional growth in the direction indicated by the arrow while the silicone gel peels from the insulating circuit substrate 2. As a consequence, the dielectric strength declines for a power semiconductor module 10 in which bubbles 11 have been produced in the silicone gel.

However, the problem of bubble production when the silicone gel has absorbed moisture is not considered in Japanese Patent Application Laid-open No. 2012-36274 or in Japanese Patent Application Laid-open No. H8-269331. In addition, while the ability to withstand high-temperature high-humidity testing is made clear in Japanese Patent Application Laid-open No. 2008-270469, with the silicone gel not being improved and due to the dependence on a method in which coating with a thermoplastic resin is carried out, a separate problem occurs, i.e., an increase in the number of steps and a reduction in the productivity.

Thus, an object of the present invention is to provide a silicone resin composition for a sealant, that exhibits an enhanced adhesiveness to the insulating circuit substrate and can prevent bubble formation even when moisture absorption occurs, that exhibits an excellent heat resistance, and that is free of problems such as cracking. A further object of the present invention is to provide a power semiconductor module that uses this composition.

In order to achieve these objects, the silicone resin composition for a sealant of a first aspect of the present invention is a silicone resin composition used as a sealant for a power semiconductor module, that after curing, has a penetration of 35 to 70 and an adhesive strength of 50 kPa to 180 kPa relative to an insulating circuit substrate having a Cu layer disposed at a surface thereof.

The silicone resin composition in the silicone resin composition for a sealant of the first aspect of the present invention preferably contains, per 100 mass parts of the base resin (A) below, 5 mass parts to 20 mass parts of the cross-linker (B) below and 0.2 mass parts to 3 mass parts of the adhesion improver (C) below:

(A) an organopolysiloxane constituted of structural units selected from the group consisting of the $(CH_2=CH)SiO_{1.5}$ unit, $RSiO_{1.5}$ unit, $R(CH_2=CH)SiO$ unit, $R_2SiO$ unit, $R_3SiO_{0.5}$ unit, $R_2(CH_2=CH)SiO_{0.5}$ unit, and $RH(CH_2=CH)SiO_{0.5}$ unit (here, R is a hydrocarbon group bonded to the Si) and having on average at least 1.5 silicon atom-bonded vinyl groups in the molecule;

(B) an organopolysiloxane constituted of structural units selected from the group consisting of the $HSiO_{1.5}$ unit, $RSiO_{1.5}$ unit, RHSiO unit, $R_2SiO$ unit, $RH_2SiO_{0.5}$ unit, $R_2HSiO_{0.5}$ unit, and $R_3SiO_{0.5}$ unit (here, R is a hydrocarbon group bonded to the Si) and having on average at least 1.5 silicon atom-bonded hydrogen groups in the molecule; and (C) an organopolysiloxane having the $H_3SiO_{0.5}$ unit as an essential unit and constituted of structural units selected from the group consisting of the $HSiO_{1.5}$ unit, $RSiO_{1.5}$ unit, RHSiO unit, $R_2SiO$ unit, $RH_2SiO_{0.5}$ unit, $R_2HSiO_{0.5}$ unit, and $R_3SiO_{0.5}$ unit (here, R is a hydrocarbon group bonded to the Si) and having on average at least 0.1 $H_3SiO_{0.5}$ unit in the molecule.

In the silicone resin composition of the first aspect of the present invention, preferably for each of the (A), (B), and (C) the Si-bonded hydrocarbon group R may be solely the methyl group or may be a mixture of the methyl group and phenyl group, but is not solely the phenyl group.

The power semiconductor module according to a second aspect of the present invention is preferably sealed by curing of the aforementioned silicone resin composition.

In accordance with the aspects of the present invention, bubble growth can be inhibited during curing of the silicone gel and the bubble growth caused by interfacial peeling can be resisted through an improved adherence between the silicone gel and the insulating circuit substrate.

DETAILED DESCRIPTION OF THE INVENTION

The silicone resin composition for a sealant of the present invention is specifically described in the following using embodiments of the invention. These embodiments do not limit the invention as set out in the claims.

The silicone resin composition for a sealant of the present invention is characterized by having, after its cure, a penetration of 35 to 70 and an adhesive strength of 50 kPa to 180 kPa relative to an insulating circuit substrate having a Cu layer at a surface thereof. This silicone resin composition contains a base agent (base resin) (A), a crosslinking agent (cross-linker) (B), and an adhesion improver (C), and the use is preferred of a silicone resin composition that additionally contains a catalyst and an organic solvent.

The base agent (A) is an organopolysiloxane constituted of structural units selected from the group consisting of the $(CH_2=CH)SiO_{1.5}$ unit, $RSiO_{1.5}$ unit, $R(CH_2=CH)SiO$ unit, $R_2SiO$ unit, $R_3SiO_{0.5}$ unit, $R_2(CH_2=CH)SiO_{0.5}$ unit, and $RH(CH_2=CH)SiO_{0.5}$ unit (here, R is a hydrocarbon group bonded to the Si) and has on average at least 1.5 and preferably 2 to 5 silicon atom-bonded vinyl groups in the molecule. The molecular structure of the polysiloxane may be straight chain, branched, or cyclic, but straight chain is more preferred since this supports the smooth development of addition polymerization. The Si-bonded hydrocarbon group R is not particularly limited and can be exemplified by saturated aliphatic hydrocarbon groups, e.g., the methyl group, and ethyl group, and aromatic hydrocarbon groups, e.g., the phenyl group and so forth. The methyl group and phenyl group are particularly preferred, but having all of the R be the phenyl group is disadvantageous because this results in a reduced dielectric strength for the silicone gel provided by the cure of the organopolysiloxane.

The crosslinking agent (B) is an organopolysiloxane constituted of structural units selected from the group consisting of the $HSiO_{1.5}$ unit, $RSiO_{1.5}$ unit, RHSiO unit, $R_2SiO$ unit, $RH_2SiO_{0.5}$ unit, $R_2HSiO_{0.5}$ unit, and $R_3SiO_{0.5}$ unit (here, R is a hydrocarbon group bonded to the Si) and has on average at least 1.5 and preferably 2 to 5 silicon atom-bonded hydrogen groups in the molecule. The molecular structure may be straight chain, branched, or cyclic, but straight chain is more preferred since this supports the smooth development of addition polymerization. The Si-bonded hydrocarbon group R is not particularly limited and can be exemplified by saturated aliphatic hydrocarbon groups, e.g., the methyl group, and ethyl group, and aromatic hydrocarbon groups, e.g., the phenyl group and so forth. The methyl group and phenyl group are particularly preferred, but having all of the R be the phenyl group is disadvantageous because this results in a reduced dielectric strength for the silicone gel provided by the cure of the organopolysiloxane.

The adhesion improver (C) is an organopolysiloxane having the $H_3SiO_{0.5}$ unit as an essential unit (i.e., has the $SiH_3O$ group bonded to an Si atom) and constituted of structural units selected from the group consisting of the $HSiO_{1.5}$ unit, $RSiO_{1.5}$ unit, RHSiO unit, $R_2SiO$ unit, $RH_2SiO_{0.5}$ unit, $R_2HSiO_{0.5}$ unit, and $R_3SiO_{0.5}$ unit (here, R is a hydrocarbon group bonded to the Si) and having on average at least 0.1 $H_3SiO_{0.5}$ unit in the molecule. The molecular structure may be straight chain, branched, or cyclic, but straight chain is more preferred since this supports the smooth development of addition polymerization. The Si-bonded hydrocarbon group R is not particularly limited and can be exemplified by saturated aliphatic hydrocarbon groups, e.g., the methyl group, and ethyl group, and aromatic hydrocarbon groups, e.g., the phenyl group. The methyl group and phenyl group are particularly preferred, but having all of the R be the phenyl group is disadvantageous because this results in a reduced dielectric strength for the silicone gel provided by the cure of the organopolysiloxane.

The catalyst used in the present invention is not particularly limited and can be exemplified by heretofore known organic solvent-soluble platinum compounds (for example, chloroplatinic acid, alcohol-modified chloroplatinic acid, and chloroplatinic acid-vinylsiloxane complexes) and rhodium compounds.

The organic solvent used in the present invention can be exemplified by aliphatic alcohols, e.g., methanol, ethanol, 2-propanol, and butanol; aromatic hydrocarbons such as benzene, toluene, and xylene; aliphatic and alicyclic hydrocarbons such as n-pentane, n-hexane, and cyclohexane; and halogenated hydrocarbons such as dichloromethane, chloroform, carbon tetrachloride, trichloroethane, trichloroethylene, and chlorofluorohydrocarbons.

The silicone resin composition provided by mixing the preceding is a single-package addition-polymerizable silicone resin composition in which the vinyl groups in the base agent (A) undergoes addition-polymerization through the hydrosilylation reaction under the action of the catalyst with the Si-bonded H groups in the crosslinking agent (B) and the adhesion improver (C), and is preferably a liquid having a low viscosity of 500 to 1000 mPa·s. Having the viscosity be low supports facile filling even into the narrow spaces in the case in which the semiconductor module is housed.

After filling of the silicone resin composition of the present invention has been performed, the silicone resin composition is preferably degassed under reduced pressure followed by curing by the application of heat to provide a silicone gel. An inadequate degassing is disadvantageous because curing then occurs with bubbles continuing to be entrapped. The bubbles present at the time of thermosetting are air bubbles that have been entrained during filling and can be prevented if an adequate degassing is performed; they have an entirely different cause from the bubbles present after standing at high temperature/high humidity as described below.

In order to prevent the bubbles produced due to standing at high temperature and high humidity, the silicone resin composition of the present invention characteristically has a specific hardness and a specific adhesiveness.

When the blending ratio of the crosslinking agent (B) with reference to the base agent (A) is raised, the crosslink density is increased and the silicone gel becomes harder. When the hardness of the silicone gel is increased, even when swelling could potentially occur due to the formation of bubbles by absorbed moisture, expansion of the intermolecular distance in the silicone gel and its swelling are still suppressed and bubble production can be inhibited.

The hardness of the silicone gel can be rendered as a numerical value using the penetration measured in accordance with JIS K 2220. The resistance to bubble growth is specified in the present invention using the penetration as an index.

The silicone resin composition for a sealant of the present invention is adjusted to have a post-cure penetration of 35 to 70 and more preferably 35 to 50.

The indicated penetration can be achieved, for example, by incorporating 5 mass parts to 20 mass parts of the crosslinking agent (B) per 100 mass parts of the base agent (A).

When the amount of incorporation of the crosslinking agent (B) is less than 5 mass parts, the penetration is then prone to be higher than 70 and bubble production readily occurs. When, conversely, the amount of incorporation of the crosslinking agent (B) is larger than 20 mass parts, the penetration is then prone to decline below 35 and cracking in the silicone gel readily occurs.

When, on the other hand, the blending ratio of the adhesion improver (C) with reference to the base agent (A) is increased, the number of Si atom-bonded $SiH_3O$ groups is increased and the bonding with metals and ceramics and the adhesiveness are then improved. Peeling of the silicone gel due to bubble growth can be suppressed when the adhesiveness is improved.

For example, JIS K 6850 is known as a method for measuring adhesive strength; however, the adhesive force was measured in the present invention, as described below, by a test in which the insulating circuit substrate was extracted from the silicone gel. This measurement method provides the most reliable data because it takes into account the surface condition of the insulating circuit substrate as well as geometric factors. The adhesive strength referenced in the present invention denotes the adhesive force measured by this extraction test.

The post-cure adhesive strength of the silicone resin composition for a sealant of the present invention is adjusted to 50 kPa to 180 kPa and more preferably to 60 kPa to 170 kPa.

This adhesive force can be achieved, for example, by incorporating 0.2 mass parts to 3 mass parts of the adhesion improver (C) per 100 mass parts of the base agent (A).

When the adhesion improver (C) is less than 0.2 mass parts and the adhesive strength is then weaker than 50 kPa, the silicone gel readily undergoes peeling and bubble production occurs easily.

In the case, on the other hand, of a large addition of the adhesion improver (C) in excess of 3 mass parts, the adhesive strength will exceed 180 kPa and may be increased up to around 340 kPa; however, because the heat resistance is then prone to deteriorate, the upper limit on the adhesive strength is 180 kPa. The heat resistance here refers to the decline in the dielectric strength caused by standing at high temperature.

As has been described above, the silicone resin composition for a sealant of the present invention is a silicone resin composition that characteristically has, after it has been cured into a silicone gel, a penetration of 35 to 70 and an adhesive strength of 50 kPa to 180 kPa and that is used as a power semiconductor module sealant that can prevent the bubble production caused by moisture absorption.

This silicone resin composition can be prepared by the addition of 5 mass parts to 20 mass parts of the crosslinking agent (B) and 0.2 mass parts to 3 mass parts of the adhesion improver (C) to 100 mass parts of the base agent (A).

By doing this, the silicone gel obtained by filling and curing the silicone resin composition of the present invention provides the excellent functional effects of being free of bubbles and cracking and having an improved dielectric strength.

EXAMPLES

Details of the present invention are described below using examples, but the present invention is not limited to or by these. In the examples that follow, a siloxane having a phenylmethyl structure was used for the base agent (A); a polyalkylhydrogensiloxane was used as the crosslinking agent (B); and an alkoxysilyl group-containing siloxane was used as the adhesion improver (C).

[Production of Silicone Resin Compositions]

Forty-one silicone resin compositions were prepared by mixing the crosslinking agent (B) at 7 different levels of 1 mass parts, 5 mass parts, 10 mass parts, 20 mass parts, 22 mass parts, 25 mass parts, or 30 mass parts, and the adhesion improver (C) at 6 different levels of 0 mass parts, 0.2 mass parts, 0.5 mass parts, 1 mass parts, 3 mass parts, or 5 mass parts, per 100 mass parts of the base agent (A).

[Measurement of the Penetration]

For the penetration, the needle penetration was measured according to JIS K 2220 using a ¼-cone with the application of a load of 9.38 g.

[Measurement of the Adhesive Force]

Figure 4A:
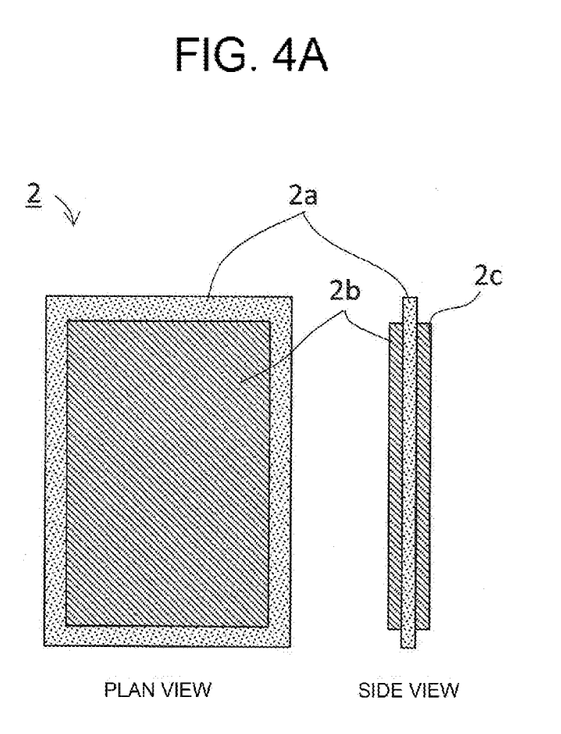
FIGS. 4A and 4B are diagrams for explaining a method of measuring adhesive strength according to an embodiment of the present invention.

The test sample is described with reference to FIG. 4A. The insulating circuit substrate 2 used in measurement of the adhesive force was obtained by bonding a Cu film on both sides of an alumina insulating substrate 2a. The external profile of the insulating substrate 2a is width 35.2 mm×length 52.5 mm×thickness 0.7 mm; a width of 1 mm is left running around the outer periphery; and the interior to this is entirely covered with a Cu film 2b, 2c (thickness in each case=0.05 mm)

Figure 4B:
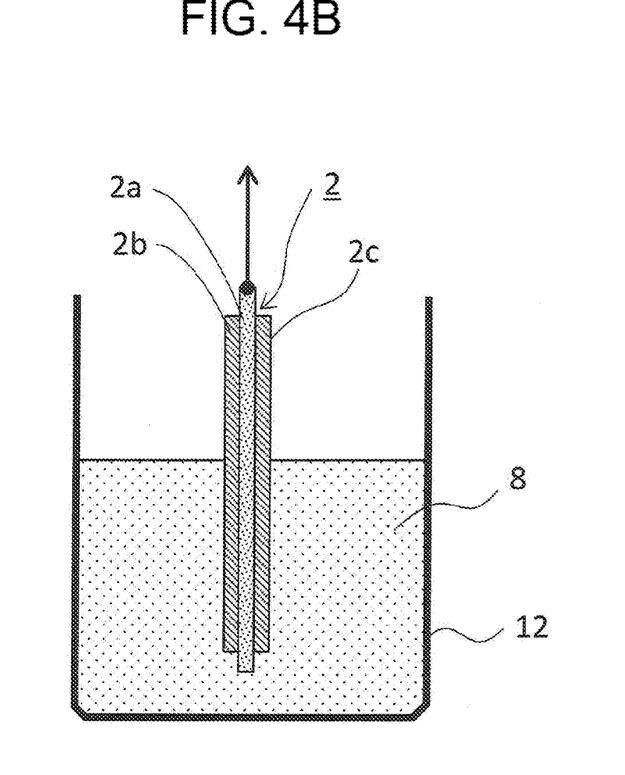

The test method is described with reference to FIG. 4B. The silicone resin composition is poured into a beaker 12; the insulating circuit substrate 2 is hung such that 40% is immersed; and a silicone gel 8 is obtained by curing by heating for 60 minutes at 80° C. After cooling to room temperature, one end of the insulating circuit substrate 2 is gripped and withdrawal is carried out at a tensile rate of 100 mm/min using a tensile tester (not shown). The value provided by dividing the maximum load during withdrawal by the wetted area for both sides of the sample was taken to be the adhesive strength in the present invention.

[Assembly of the Power Semiconductor Module]

An M249 (external profile 62 mm×108 mm) from Fuji Electric Co., Ltd. was used as the package for the power semiconductor module. A DCB substrate having Cu film bonded on an alumina substrate that conformed to the M249 was used as the insulating circuit substrate, and one IGBT and two FWD devices were mounted as the power semiconductor devices followed by incorporation in the package. The thusly assembled package was thoroughly dried by heating for 60 minutes at 150° C. followed by cooling to normal temperature, and a silicone resin composition selected from the different blending amounts as described above was injected and was cured by heating for 60 minutes at 80° C.

[High-Temperature Humidified Testing]

This is a test in which the semiconductor module assembled by the aforementioned procedure is introduced into a high-temperature humidified chamber, held for 24 hours at 85° C. and 85% RH, subsequently removed from the high-temperature humidified chamber and cooled to room temperature, then held for 60 minutes on a 125° C. hot plate, and thereafter visually inspected and evaluated for the presence/absence of bubble production.

[Heat Resistance Testing]

The semiconductor module assembled by the aforementioned procedure was introduced into a thermostat and was held for 2000 hours at 215° C. and was subsequently removed from the thermostat and cooled to room temperature. The presence/absence of dielectric breakdown was determined during the application for 10 seconds of a voltage of 4.1 kV between the emitter terminal and collector terminal.

[Reliability Testing]

This is a test in which the semiconductor module assembled by the aforementioned procedure is introduced into a temperature-cycling tester; a temperature cycling test is performed by repeating 300 cycles in alternation of holding for 70 minutes at −40° C. and holding for 70 minutes at 125° C.; and the semiconductor module is removed from the temperature-cycling tester and is visually inspected to evaluate for cracking of the silicone gel.

[Test Results]

The test results for Examples 1 to 10 and Comparative Examples 1 to 31 are given in Table 1. "Positive" in the defect mode column in Table 1 indicates that the particular defect mode was observed in the test. On the other hand, "Negative" in the defect mode column in Table 1 indicates that the defect mode was not observed in the test.

Figure 2:
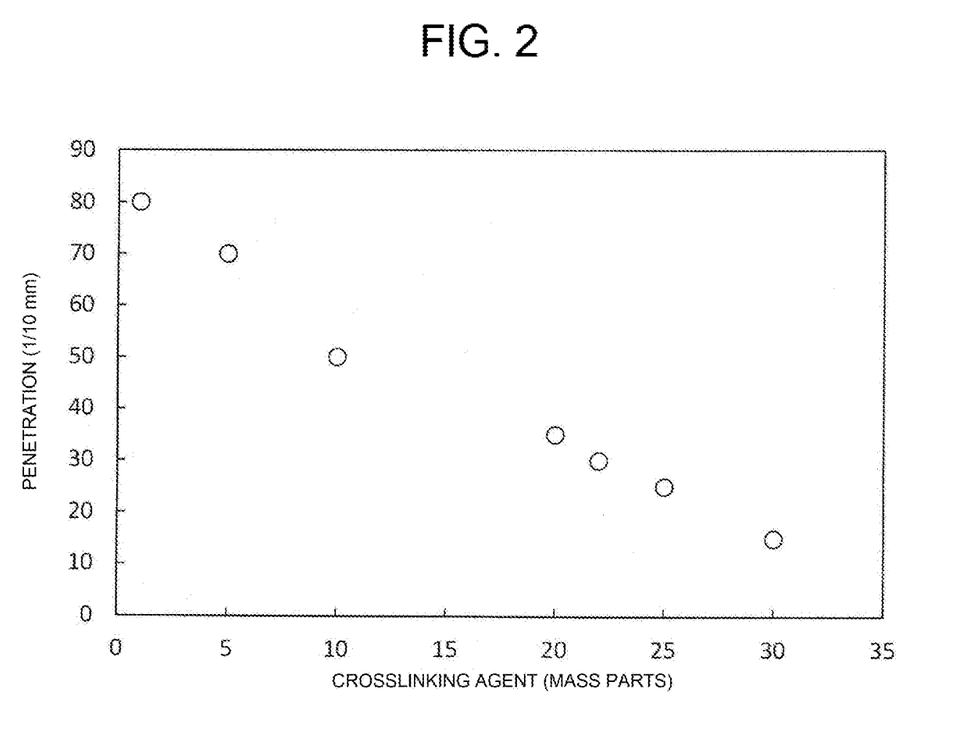
FIG. 2 is a diagram that shows the relationship between the amount of cross-linker incorporation and the penetration according to an embodiment of the present invention.

The relationship between the amount of crosslinking agent incorporation and the penetration is shown in FIG. 2. The silicone gel becomes harder and the penetration declines as the amount of crosslinking agent incorporation increases. It is shown that the penetration can be adjusted mainly through the amount of crosslinking agent incorporation. When the crosslinking agent is incorporated at more than 20 mass parts, the penetration falls below 35 and cracking in the silicone gel is then readily produced.

Figure 3:
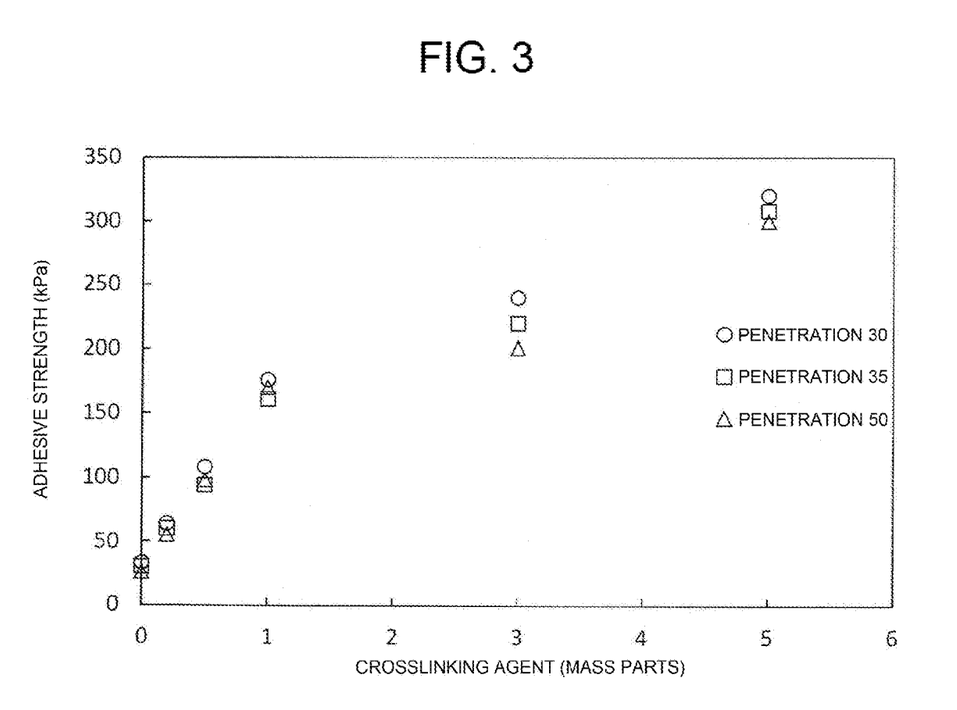
FIG. 3 is a diagram that shows the relationship between the amount of adhesion improver incorporation and the adhesive strength according to an embodiment of the present invention.

The relationship between the amount of adhesion improver incorporation and the adhesive strength is given in FIG. 3. The adhesive strength increases as the incorporation of the adhesion improver increases. The adhesive strength is also increased by increasing the amount of crosslinking agent incorporation; however, increasing the amount of adhesion improver incorporation is more effective, and the adhesive strength can be increased by increasing the amount of adhesion improver incorporation. However, when the adhesion improver is incorporated at more than 3 mass parts, the heat resistance of the silicone gel then readily declines and the silicone gel undergoes thermal degradation and the dielectric strength readily declines.

Figure 1:
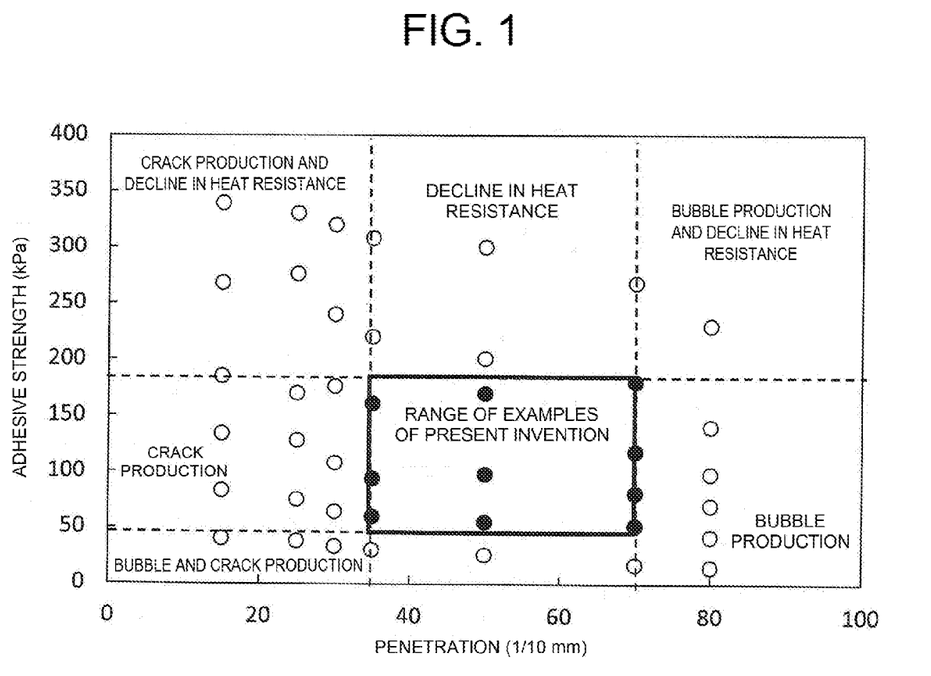
FIG. 1 is a diagram that shows a preferred range for the penetration and tensile strength of a silicone resin composition according to an embodiment of the present invention.

Bubble production is related to both the hardness of the silicone gel and its adhesive strength. A diagram is constructed in FIG. 1 having the adhesive strength for its vertical axis and the penetration for its horizontal axis; this diagram shows the region of the examples of the present invention, which is favorable as a sealant for a power semiconductor module, and the regions of the comparative examples, which are unfavorable for this application.

Preferred characteristics, i.e., no appearance of cracks in the silicone gel, no decline in the heat resistance, and no bubble production even when moisture absorption occurs, accrue in the examples, which are within the range of a penetration of 35 to 70 and an adhesive strength of 50 kPa to 180 kPa specified by the present invention.

The comparative examples, which are not in this range, are unsuitable for application to power semiconductor modules due to crack production, a decline in heat resistance, and/or bubble production.

TABLE 1

| | mixing ratio | | | measurement results | | defect mode | | |
| --- | --- | --- | --- | --- | --- | --- | --- | --- |
| | (A) mass parts | (B) mass parts | (C) mass parts | adhesive strength kPa | penetration 1/10 mm | bubble production | decline in heat resistance | crack production |
| Working Example 1 | 100 | 5 | 0.2 | 52 | 70 | Negative | Negative | Negative |
| Working Example 2 | 100 | 5 | 0.5 | 81 | 70 | Negative | Negative | Negative |
| Working Example 3 | 100 | 5 | 1 | 118 | 70 | Negative | Negative | Negative |
| Working Example 4 | 100 | 5 | 3 | 180 | 70 | Negative | Negative | Negative |

TABLE 1-continued

|  | mixing ratio | | | measurement results | | defect mode | | |
|---|---|---|---|---|---|---|---|---|
|  | (A) mass parts | (B) mass parts | (C) mass parts | adhesive strength kPa | penetration 1/10 mm | bubble production | decline in heat resistance | crack production |
| Working Example 5 | 100 | 10 | 0.2 | 55 | 50 | Negative | Negative | Negative |
| Working Example 6 | 100 | 10 | 0.5 | 98 | 50 | Negative | Negative | Negative |
| Working Example 7 | 100 | 10 | 1 | 170 | 50 | Negative | Negative | Negative |
| Working Example 8 | 100 | 20 | 0.2 | 60 | 35 | Negative | Negative | Negative |
| Working Example 9 | 100 | 20 | 0.5 | 94 | 35 | Negative | Negative | Negative |
| Working Example 10 | 100 | 20 | 1 | 161 | 35 | Negative | Negative | Negative |
| Comparative Example 1 | 100 | 22 | 3 | 240 | 30 | Negative | Positive | Positive |
| Comparative Example 2 | 100 | 22 | 5 | 320 | 30 | Negative | Positive | Positive |
| Comparative Example 3 | 100 | 25 | 3 | 276 | 25 | Negative | Positive | Positive |
| Comparative Example 4 | 100 | 25 | 5 | 330 | 25 | Negative | Positive | Positive |
| Comparative Example 5 | 100 | 30 | 1 | 185 | 15 | Negative | Positive | Positive |
| Comparative Example 6 | 100 | 30 | 3 | 268 | 15 | Negative | Positive | Positive |
| Comparative Example 7 | 100 | 30 | 5 | 339 | 15 | Negative | Positive | Positive |
| Comparative Example 8 | 100 | 22 | 0.2 | 64 | 30 | Negative | Negative | Positive |
| Comparative Example 9 | 100 | 22 | 0.5 | 108 | 30 | Negative | Negative | Positive |
| Comparative Example 10 | 100 | 22 | 1 | 176 | 30 | Negative | Negative | Positive |
| Comparative Example 11 | 100 | 25 | 0.2 | 75 | 25 | Negative | Negative | Positive |
| Comparative Example 12 | 100 | 25 | 0.5 | 128 | 25 | Negative | Negative | Positive |
| Comparative Example 13 | 100 | 25 | 1 | 170 | 25 | Negative | Negative | Positive |
| Comparative Example 14 | 100 | 30 | 0.2 | 134 | 15 | Negative | Negative | Positive |
| Comparative Example 15 | 100 | 30 | 0.5 | 185 | 15 | Negative | Negative | Positive |
| Comparative Example 16 | 100 | 22 | 0 | 33 | 30 | Positive | Negative | Positive |
| Comparative Example 17 | 100 | 25 | 0 | 38 | 25 | Positive | Negative | Positive |
| Comparative Example 18 | 100 | 30 | 0 | 40 | 15 | Positive | Negative | Positive |
| Comparative Example 19 | 100 | 5 | 5 | 268 | 70 | Negative | Positive | Negative |
| Comparative Example 20 | 100 | 10 | 3 | 201 | 50 | Negative | Positive | Negative |
| Comparative Example 21 | 100 | 10 | 5 | 300 | 50 | Negative | Positive | Negative |
| Comparative Example 22 | 100 | 20 | 3 | 220 | 35 | Negative | Positive | Negative |
| Comparative Example 23 | 100 | 20 | 5 | 308 | 35 | Negative | Positive | Negative |
| Comparative Example 24 | 100 | 20 | 0 | 30 | Not measured | Positive | Negative | Negative |
| Comparative Example 25 | 100 | 10 | 0 | 26 | Not measured | Positive | Negative | Negative |
| Comparative Example 26 | 100 | 5 | 0 | 17 | Not measured | Positive | Negative | Negative |
| Comparative Example 27 | 100 | 1 | 0 | 15 | Not measured | Positive | Negative | Negative |
| Comparative Example 28 | 100 | 1 | 0.2 | 42 | Not measured | Positive | Negative | Negative |
| Comparative Example 29 | 100 | 1 | 0.5 | 70 | Not measured | Positive | Negative | Negative |
| Comparative Example 30 | 100 | 1 | 1 | 98 | Not measured | Positive | Negative | Negative |
| Comparative Example 31 | 100 | 1 | 3 | 140 | Not measured | Positive | Negative | Negative |

TABLE 1-continued

| | mixing ratio | | | measurement results | | defect mode | | |
|---|---|---|---|---|---|---|---|---|
| | (A) mass parts | (B) mass parts | (C) mass parts | adhesive strength kPa | penetration $1/10$ mm | bubble production | decline in heat resistance | crack production |
| Comparative Example 32 | 100 | 1 | 5 | 230 | Not measured | Positive | Negative | Negative |

What is claimed is:

1. A silicone resin composition for use as a sealant for a power semiconductor module that includes an insulating circuit substrate having a Cu layer formed on a surface thereof,
the silicone resin composition formed on the Cu layer of the insulating circuit substrate, the silicone resin composition having, after curing, a penetration of 35 to 70 and an adhesive strength of 50 to 180 kPa between the silicone resin composition and the insulating circuit substrate having the Cu layer thereof, the penetration being measured in accordance with JIS K 2220.

2. The silicone resin composition for use as a sealant according to claim 1, wherein the penetration is 35 to 50.

3. The silicone resin composition for use as a sealant according to claim 1, wherein the silicone resin composition comprises per 100 mass parts of a base resin (A):
5 mass parts to 20 mass parts of a cross-linker (B); and
0.2 mass parts to 3 mass parts of an adhesion improver (C), wherein
the base resin (A) is an organopolysiloxane constituted of structural units selected from the group consisting of the $(CH_2=CH)SiO_{1.5}$ unit, $RSiO_{1.5}$ unit, $R(CH_2=CH)SiO$ unit, $R_2SiO$ unit, $R_3SiO_{0.5}$ unit, $R_2(CH_2=CH)SiO_{0.5}$ unit, and $RH(CH_2=CH)SiO_{0.5}$ unit, R indicating a hydrocarbon group bonded to the Si, and having on average at least 1.5 silicon atom-bonded vinyl groups in the molecule,
the cross-linker (B) is an organopolysiloxane constituted of structural units selected from the group consisting of the $HSiO_{1.5}$ unit, $RSiO_{1.5}$ unit, $RHSiO$ unit, $R_2SiO$ unit, $RH_2SiO_{0.5}$ unit, $R_2HSiO_{0.5}$ unit, and $R_3SiO_{0.5}$ unit, R indicating a hydrocarbon group bonded to the Si, and having on average at least 1.5 silicon atom-bonded hydrogen groups in the molecule, and the adhesion improver (C) is an organopolysiloxane having the $H_3SiO_{0.5}$ unit as an essential unit and constituted of structural units selected from the group consisting of the $HSiO_{1.5}$ unit, $RSiO_{1.5}$ unit, $RHSiO$ unit, $R_2SiO$ unit, $RH_2SiO_{0.5}$ unit, $R_2HSiO_{0.5}$ unit, and $R_3SiO_{0.5}$ unit, R indicating a hydrocarbon group bonded to the Si, and having on average at least 0.1 $H_3SiO_{0.5}$ unit in the molecule.

4. The silicone resin composition for use as a sealant according to claim 3, wherein the silicone resin composition further comprises a catalyst and/or an organic solvent.

5. The silicone resin composition for a sealant according to claim 4, wherein the catalyst includes an organic solvent-soluble platinum compound or a rhodium compound.

6. The silicone resin composition for use as a sealant according to claim 4, wherein the organic solvent includes any one of aliphatic alcohols, aromatic hydrocarbons, aliphatic and halogenated hydrocarbons.

7. The silicone resin composition for use as a sealant according to claim 3, wherein, in each of the (A), (B), and (C), the Si-bonded hydrocarbon group R consists of the methyl group or consists of a mixture that includes the methyl group.

8. The silicone resin composition for use as a sealant according to claim 7, wherein the Si-bonded hydrocarbon group R consists of the mixture that includes the methyl group and further includes a phenyl group.

9. A power semiconductor module sealed by curing of the silicone resin composition according to claim 7.

10. A power semiconductor module sealed by curing of the silicone resin composition according to claim 3.

11. A power semiconductor module sealed by curing of the silicone resin composition according to claim 1.

* * * * *